(12) United States Patent
Yamaide (10) Patent No.: US 8,263,470 B2
(45) Date of Patent: Sep. 11, 2012

(54) METHOD OF FABRICATING SEMICONDUCTOR DEVICE

(75) Inventor: Katsuhiro Yamaide, Miyazaki (JP)

(73) Assignee: Lapis Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/926,797

(22) Filed: Dec. 9, 2010

(65) Prior Publication Data
US 2011/0151638 A1 Jun. 23, 2011

(30) Foreign Application Priority Data
Dec. 21, 2009 (JP) ................................. 2009-289119

(51) Int. Cl.
*H01L 21/8222* (2006.01)

(52) U.S. Cl. ................................. 438/340; 257/E21.608

(58) Field of Classification Search .................. 438/340, 438/202, 205, 309; 257/E21.608
See application file for complete search history.

(56) References Cited

U.S. PATENT DOCUMENTS

| | | | | | |
|---|---|---|---|---|---|
| 4,484,388 | A | * | 11/1984 | Iwasaki | 438/207 |
| 6,066,520 | A | * | 5/2000 | Suzuki | 438/202 |
| 7,095,094 | B2 | * | 8/2006 | Kerr et al. | 257/526 |
| 7,709,925 | B2 | * | 5/2010 | Takahashi et al. | 257/505 |
| 2003/0193077 | A1 | * | 10/2003 | Fujii | 257/656 |

FOREIGN PATENT DOCUMENTS

JP 11-121460 A 4/1999
* cited by examiner

*Primary Examiner* — William D Coleman
*Assistant Examiner* — Christine Enad
(74) *Attorney, Agent, or Firm* — Rabin & Berdo, P.C.

(57) ABSTRACT

There is provided a method of fabricating a semiconductor including: forming a first and a second bipolar transistors on a semiconductor substrate; forming a dummy layer on, or on the periphery of, at least one region of the emitter region, the base region, or the collector region of the second bipolar transistor and on an area surrounding a contact region for establishing an electrical connection to the outside in the at least one of the emitter region, the base region, or the collector region; forming an insulation layer so as to cover the first bipolar transistor, the second bipolar transistor, and the dummy layer; forming, together with the insulation layer and in a contact region of each region of the first bipolar transistor and the second bipolar transistor, a contact hole for establishing contact with each of those regions; and embedding a conductive member in the contact holes.

11 Claims, 11 Drawing Sheets

METHOD OF FABRICATING SEMICONDUCTOR DEVICE

CROSS-REFERENCE TO RELATED APPLICATION

This application is based on and claims priority under 35 USC 119 from Japanese Patent Application No. 2009-289119 filed on Dec. 21, 2009, the disclosure of which is incorporated by reference herein.

BACKGROUND

1. Technical Field

The present invention relates to a method of fabricating a semiconductor device in which plural bipolar transistors having different DC current gains (hfe) are hybridized (consolidated).

2. Related Art

Conventionally, technologies have been proposed which, in a case where bipolar transistors having various emitter areas are placed on the same semiconductor substrate in logical LSIs and analog ICs, suppress variations in the DC current gains (hfe) in an IC in which bipolar transistors having emitter regions of different sizes are hybridized (e.g., see Japanese Patent Application Laid-Open (JP-A) No. 11-121460).

On the other hand, there is also a case where two bipolar transistors having different DC current gains (hfe) are hybridized on the same semiconductor substrate. In this case, there is a method of hybridizing the two bipolar transistors having different DC current gains (hfe) on the same semiconductor substrate by changing the concentration of an impurity diffusion layer that becomes emitter regions, base regions, and collector regions.

Here, the depths at which embedded electrodes reach the emitter regions can be varied by changing the contact depths (the depths of contact holes) because the emitter regions are shallow and their impurity diffusion layer concentration gradient is large, so the effective impurity diffusion layer concentration changes, and the DC current gains (hfe) can be changed. For this reason, in a case where this property is utilized to hybridize two bipolar transistors having different DC current gains (hfe) on the same semiconductor substrate, the hybridization can also be realized by changing the contact depth of each bipolar transistor. Of course, the hybridization can be realized by changing the contact depth also in another region (the base region, the collector region).

However, in order to change the concentration of the impurity diffusion layer that becomes the emitter regions, the base regions, and the collector regions, it is necessary to divide implantation, and it is necessary to add implantation steps depending on the number of impurity diffusion layers of the concentrations intended.

Further, also in order to change the contact depths of the emitter regions, it is necessary to add a photolithography/etching step depending on the number of the contact depths intended, and the constraints are large particularly in a process where only the formation of contact holes with diameters of a single size is allowed.

SUMMARY

Thus, it is an object of the present invention to provide a semiconductor device fabricating method with which a semiconductor device in which plural bipolar transistors having different DC current gains (hfe) are hybridized can be obtained easily and with a few number of steps.

This problem is solved by the following means. That is, an aspect of the present invention provides a method of fabricating a semiconductor, the method including:

forming a first bipolar transistor configured by an emitter region, a base region, and a collector region on a semiconductor substrate;

forming a second bipolar transistor configured by an emitter region, a base region, and a collector region on the semiconductor substrate;

forming a dummy layer on, or on the periphery of, at least one region of the emitter region, the base region, or the collector region of the second bipolar transistor and on an area surrounding a contact region for establishing an electrical connection to the outside in the at least one of the emitter region, the base region, or the collector region;

forming an insulation layer so as to cover the first bipolar transistor, the second bipolar transistor, and the dummy layer;

forming, together with the insulation layer and in a contact region of each region of the first bipolar transistor and the second bipolar transistor, a contact hole for establishing contact with each of those regions; and embedding a conductive member in the contact holes.

According to the present invention, there can be provided a semiconductor device fabricating method with which a semiconductor device in which plural bipolar transistors having different DC current gains (hfe) are hybridized can be obtained easily and with a few number of steps.

BRIEF DESCRIPTION OF THE DRAWINGS

Exemplary embodiments of the present invention will be described in detail based on the following figures, wherein.

DETAILED DESCRIPTION

Exemplary embodiments of the present invention will be described below with reference to the drawings. Members having substantially the same functions will be denoted by the same reference signs throughout the drawings, and redundant description of those members will sometimes be omitted.

(First Exemplary Embodiment)

FIGS. 1A to 3J are process drawings showing a semiconductor device fabricating method pertaining to a first exemplary embodiment.

The semiconductor device fabricating method pertaining to the first exemplary embodiment will be described in regard to a method of fabricating a semiconductor device in which two bipolar transistors having different DC current gains (hfe), a CMOS transistor, and a DMOS transistor are hybridized on the same semiconductor substrate.

Figure 1A:
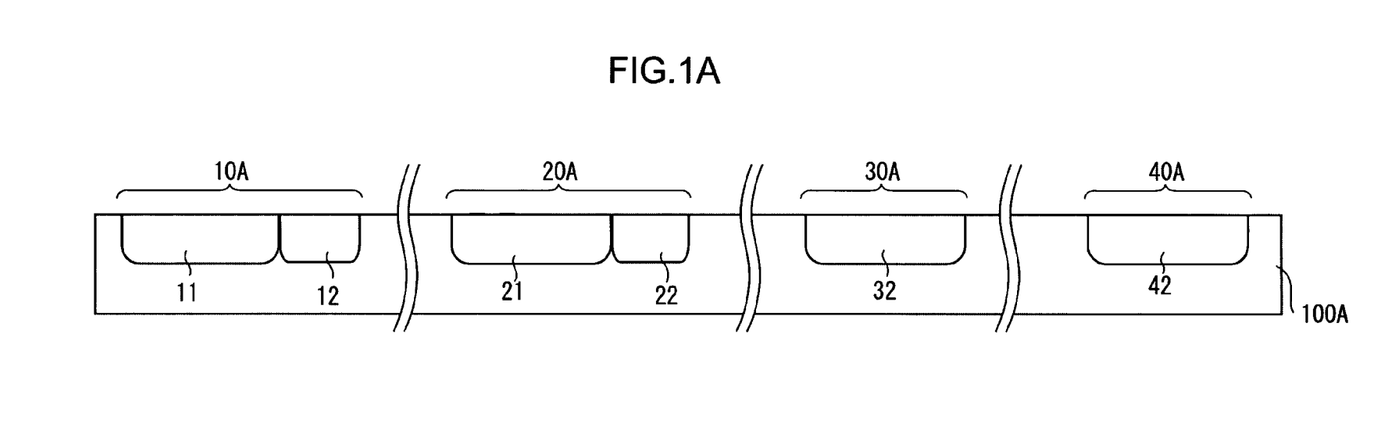
FIGS. 1A to 1D are process drawings showing a semiconductor device fabricating method pertaining to a first exemplary embodiment.

First, as shown in FIG. 1A, a semiconductor substrate 100A is prepared. Then, a photoresist (not shown) having predetermined openings is formed by photolithography and etching on the semiconductor substrate 100A. Then, this photoresist is used as a mask to form, by P-type ion implantation, a P-type well region 11 in a first bipolar transistor formation region 10A and a P-type well region 21 in a second bipolar transistor formation region 20A.

Next, a photoresist (not shown) having predetermined openings is formed by photolithography and etching. Then, this photoresist is used as a mask to form, by N-type ion implantation, an N-type well region 12 in the first bipolar transistor formation region 10A, an N-type well region 22 in the second bipolar transistor formation region 20A, an N-type well region 32 in a CMOS transistor formation region 30A, and an N-type well region 42 in a DMOS transistor formation region 40A.

Figure 1B:
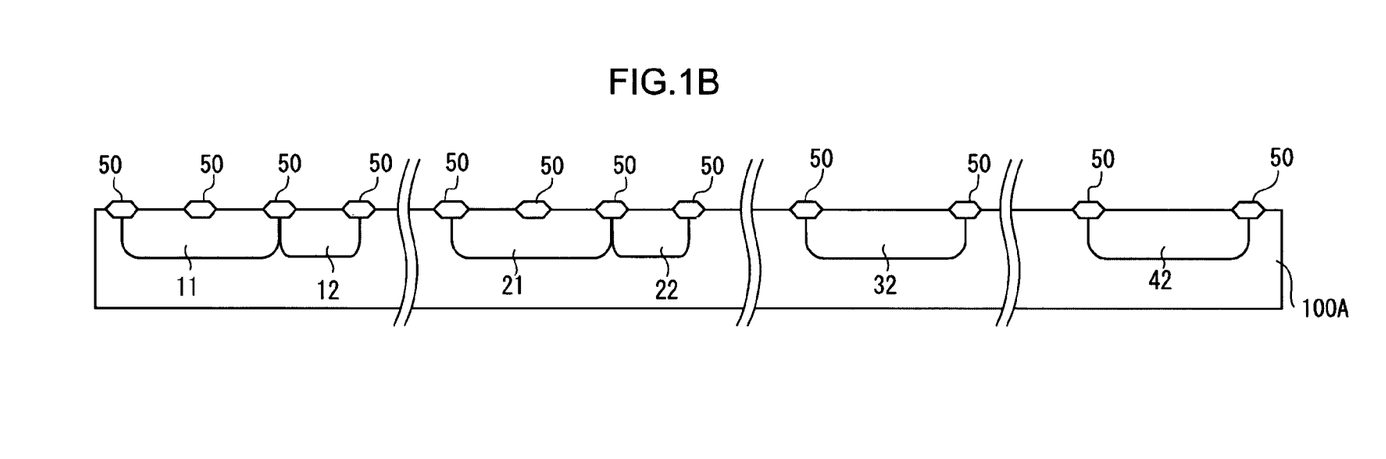

Next, as shown in FIG. 1B, a photoresist (not shown) having predetermined openings is formed by photolithography and etching on the semiconductor substrate 100A. Then, this photoresist is used as a mask to form, by local oxidation of silicon (LOCOS), a field oxidation layer 50 (a LOCOS oxidation layer) for separating each element (each transistor) and for separating each region (emitter regions, base regions, and collector regions) in the first bipolar transistor formation region 10A and the second bipolar transistor formation region 20A.

Figure 1C:
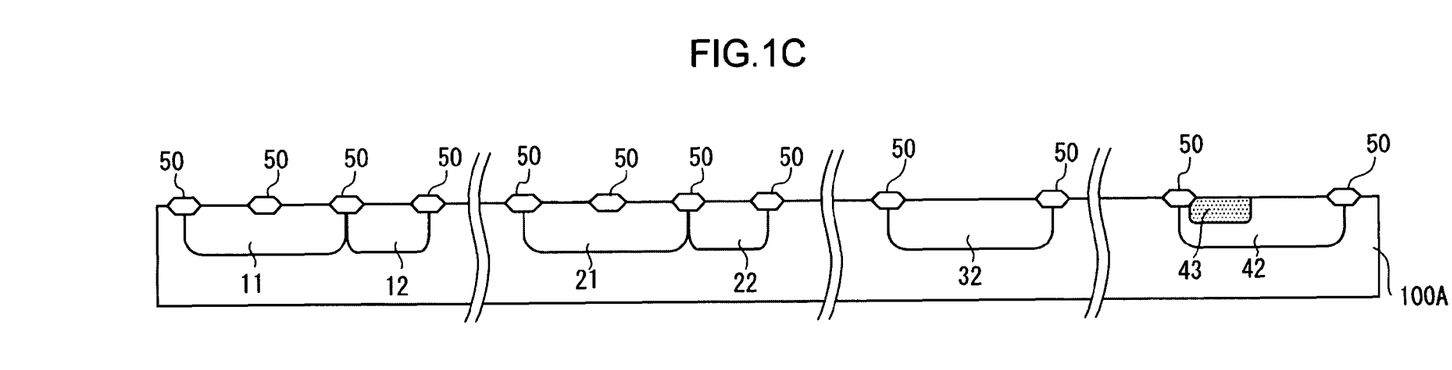

Next, as shown in FIG. 1C, a photoresist (not shown) having predetermined openings is formed by photolithography and etching on the semiconductor substrate 100A. Then, this photoresist is used as a mask to form, by P-type ion implantation, a P-type impurity diffusion layer that becomes a body layer 43 in the DMOS transistor formation region 40A.

Figure 1D:
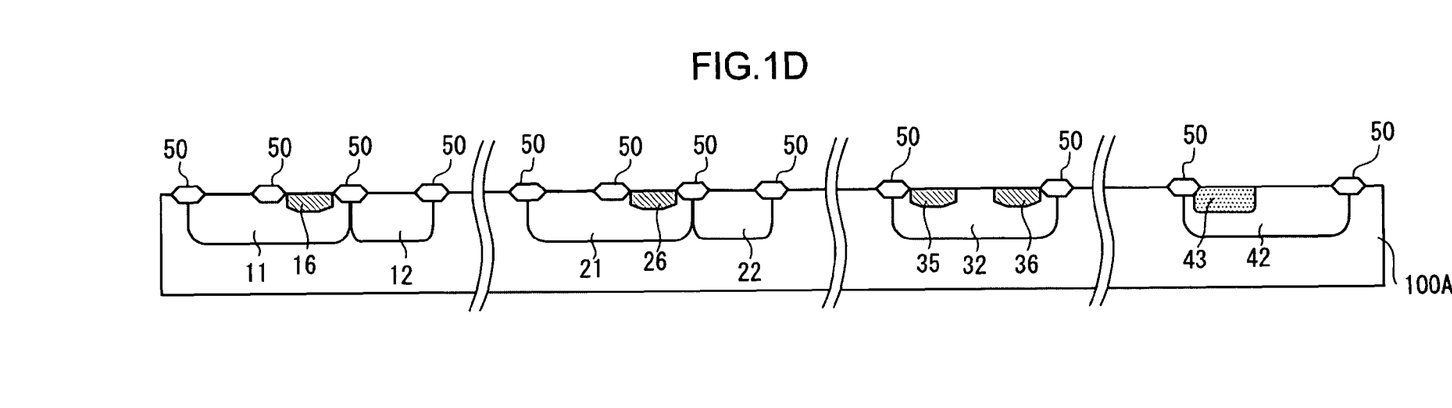

Next, as shown in FIG. 1D, a photoresist (not shown) having predetermined openings is formed by photolithography and etching on the semiconductor substrate 100A. Then, this photoresist is used as a mask to form, by P-type ion implantation, a P+ type impurity diffusion layer that becomes a base region 16 in one region (a region on the N-type well region 12 side) of the P-type well region 11 in the first bipolar transistor formation region 10A separated by the field oxidation layer 50.

At the same time as this, the photoresist is used to form, by P-type ion implantation, a P+ type impurity diffusion layer that becomes a base region 26 in one region (a region on the N-type well region 22 side) of the P-type well region 21 in the second bipolar transistor formation region 20A separated by the field oxidation layer 50.

In addition, at the same time as these, the photoresist is used to form, by P-type ion implantation, two P+ type impurity diffusion layers that become a source region 35 and a drain region 36 in both end portions of the N-type well region 32 in the CMOS transistor formation region 30A.

Figure 2E:
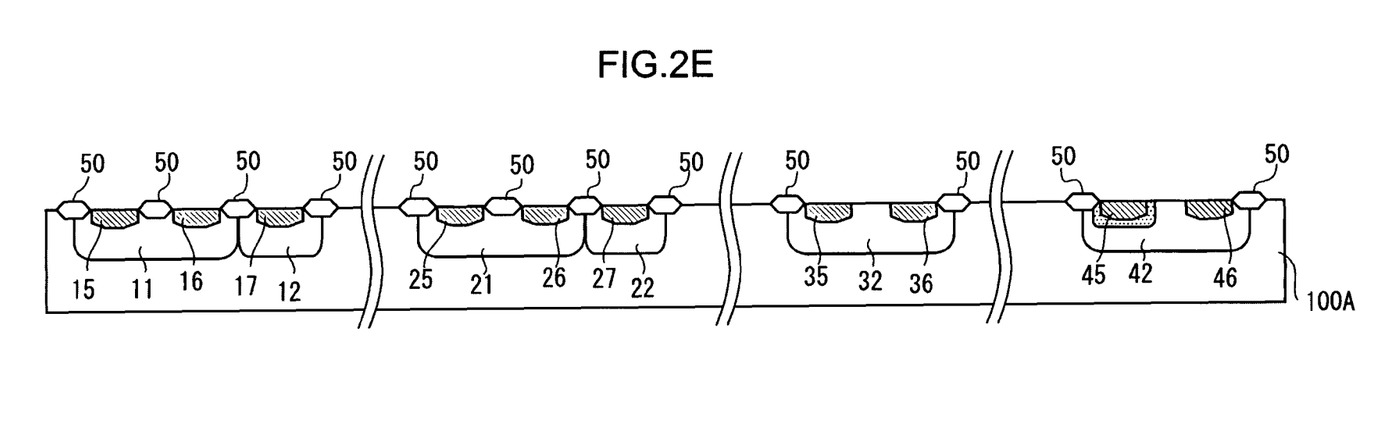
FIGS. 2E to 2H are process drawings showing the semiconductor device fabricating method pertaining to the first exemplary embodiment.

Next, as shown in FIG. 2E, a photoresist (not shown) having predetermined openings is formed by photolithography and etching on the semiconductor substrate 100A. Then, this photoresist is used as a mask to form, by N-type ion implantation, an N+ type impurity diffusion layer that becomes an emitter region 15 in one region (a region on the opposite side of the N-type well region 12 side) of the P-type well region 11 in the first bipolar transistor formation region 10A separated by the field oxidation layer 50 and to also form an N+ type impurity diffusion layer that becomes a collector region 17 in the N-type well region 12.

At the same time as this, the photoresist is used to form, by N-type ion implantation, an N+ type impurity diffusion layer that becomes an emitter region 25 in one region (a region on the opposite side of the N-type well region 22 side) of the P-type well region 21 in the second bipolar transistor formation region 20A separated by the field oxidation layer 50 and to also form an N+ type impurity diffusion layer that becomes a collector region 27 in the N-type well region 22.

In addition, at the same time as these, the photoresist is used to form, by N-type ion implantation, two N+ type impurity diffusion layers that become a source region 45 and a drain region 46 in both end portions (one end portion of which is the body layer 43) of the N-type well region 42 in the DMOS transistor formation region 40A.

Figure 2F:
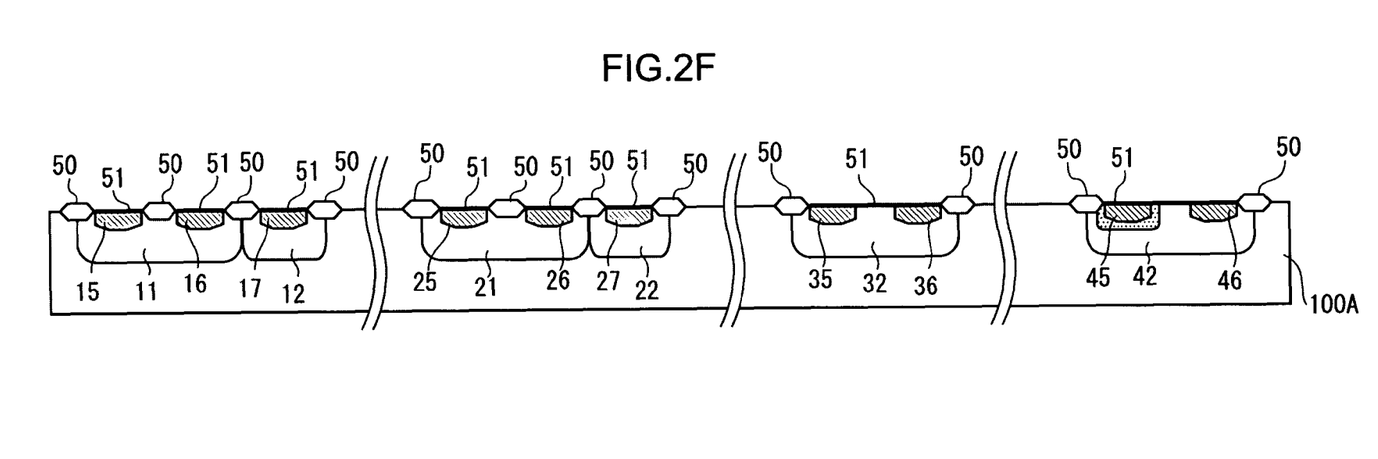

Next, as shown in FIG. 2F, an oxidation layer 51 is formed by thermal oxidation on region surface layers separated by the field oxidation layer 50 in the first bipolar transistor formation region 10A, the second bipolar transistor formation region 20A, the CMOS transistor formation region 30A, and the DMOS transistor formation region 40A. This oxidation layer 51 functions as a gate oxidation layer in the CMOS transistor formation region 30A and the DMOS transistor formation region 40A.

Figure 2G:
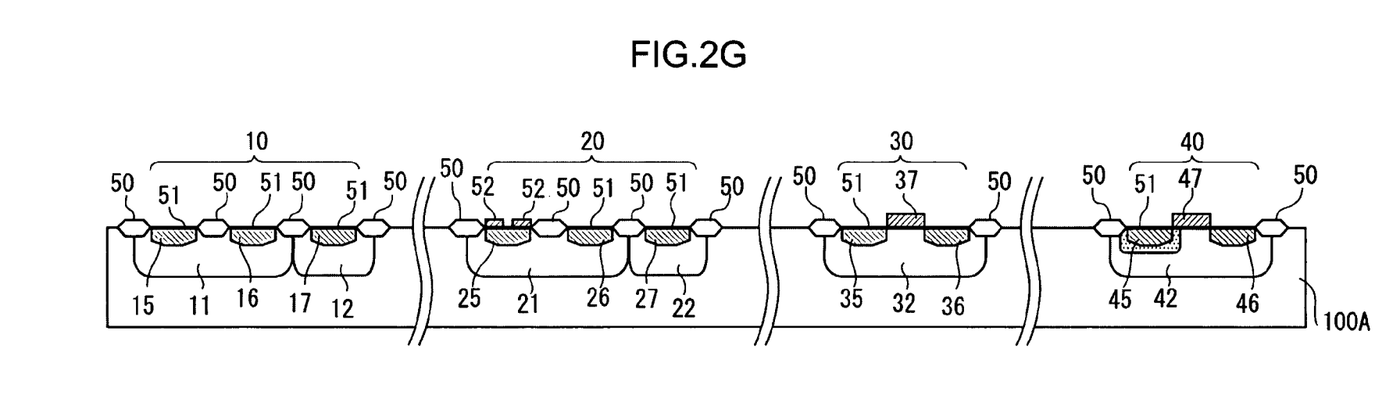

Next, as shown in FIG. 2G polysilicon is deposited in the CMOS transistor formation region 30A to form a polysilicon layer. Unwanted portions of the polysilicon layer are removed by etching, whereby a gate electrode 37 is formed on the oxidation layer 51 between the source region 35 and the drain region 36.

At the same time as this, polysilicon is deposited in the DMOS transistor formation region 40A to form a polysilicon layer. Unwanted portions of the polysilicon layer are removed by etching, whereby a gate electrode 47 is formed on the oxidation layer 51 between the source region 45 and the drain region 46.

Through the above process, each element of a first bipolar transistor 10, a second bipolar transistor 20, a CMOS transistor 30, and a DMOS transistor 40 is formed on the semiconductor substrate 100A.

Figure 4A:
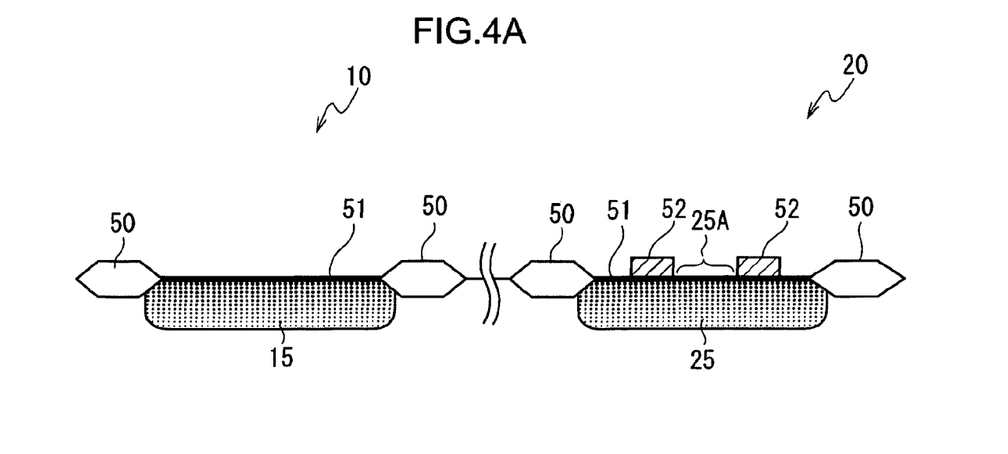
FIGS. 4A to 4C are process drawings showing emitter regions, and their environs, of first and second bipolar transistors in the semiconductor device fabricating method pertaining to the first exemplary embodiment.

Here, as shown in FIG. 4A, together with the formation of the gate electrodes in the CMOS transistor formation region 30A and the DMOS transistor formation region 40A, a polysilicon layer is similarly formed on the emitter region 25 (or on the periphery of the emitter region 25; in the present exemplary embodiment, on the emitter region 25) in the second bipolar transistor formation region 20A and on the environs of a contact region 25A in the emitter region 25. The polysilicon layer is etched to forma dummy layer 52 comprising that polysilicon layer.

Figure 5:
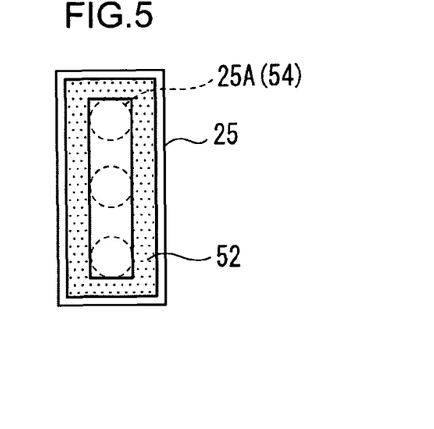
FIG. 5 is a plan drawing for describing an example of a dummy layer formation position in the semiconductor device fabricating method pertaining to the first exemplary embodiment.

Specifically, for example, as shown in FIG. 5, the dummy layer 52 is formed so as to surround the contact region 25A of the emitter region 25, that is, the region in which contact holes 54 (in the present exemplary embodiment, three contact holes 54) are formed, and so as to contact the contact holes 54 to be formed and such that its planar shape (its shape when seen from the substrate top surface) is rectangular. Because this dummy layer 52 comprising the polysilicon layer is formed so as to contact the contact holes 54 to be formed, the dummy layer 52 becomes electrically connected to embedded electrodes 55 embedded in the contact holes 54.

It is good, for example, for the thickness of the dummy layer 52 to be thinner than each region (the emitter regions, the base regions, and the collector regions) of the first bipolar transistor 10 and the second bipolar transistor 20. Specifically, for example, the thickness of the dummy layer 52 is from 0.1 μm to 0.4 μm. Further, the width of the dummy layer 52 is about 0.3 μm, for example.

The dummy layer 52 is not limited to a polysilicon layer and may also be a layer comprising another material (e.g., a conductive layer or an insulation layer).

Figure 6:
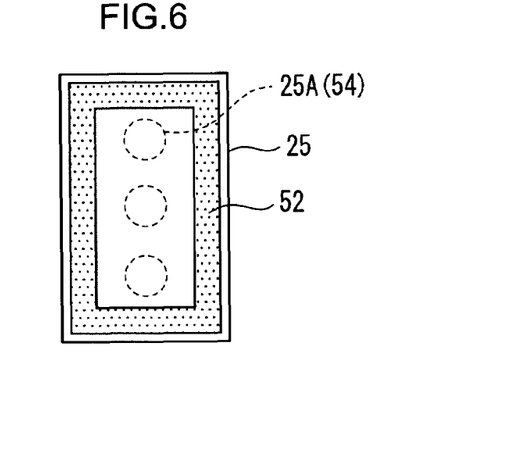
FIG. 6 is a plan drawing for describing another example of a dummy layer formation position in the semiconductor device fabricating method pertaining to the first exemplary embodiment.

The dummy layer 52 is not limited to a configuration where it is formed so as to contact the contact holes 54 to be formed. As shown in FIG. 6, the dummy layer 52 may also be formed so as to not contact the contact holes 54 to be formed (that is, apart (e.g., about 0.2 μm apart) from the contact holes 54 to be formed).

Figure 7:
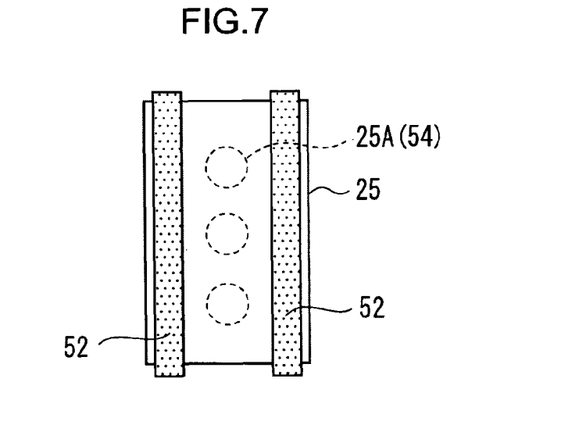
FIG. 7 is a plan drawing for describing still another example of a dummy layer formation position in the semiconductor device fabricating method pertaining to the first exemplary embodiment.

Further, the dummy layer 52 is not limited to a configuration where it is formed surrounding the contact holes 54 to be formed. As shown in FIG. 7, the dummy layer 52 may also have a configuration where two separate dummy layers 52 are formed so as to sandwich the contact holes 54 to be formed.

Further, the dummy layer 52 is not limited to a configuration where it is formed surrounding or sandwiching the entire group of contact holes 54 to be formed (in the present exemplary embodiment, three contact holes 54). The dummy layer 52 may also have a configuration where it is formed surrounding or sandwiching each of the plural contact holes 54.

The planar shape of the dummy layer 52 is not limited to a rectangular shape and can also be an arbitrary shape such as a circular shape. It is not the case that the planar shape of the dummy layer 52 is limited.

The contact region 25A of the emitter region 25 (the contact region of another region) is a region for establishing an electrical connection to the outside in each region after an interlayer insulation layer 53 has been formed and is a region in which, when forming the contact holes 54, those contact holes 54 are formed in each region surface layer portion together with that interlayer insulation layer 53. Additionally, the depth of the contact holes 54 in each region surface layer portion is called a contact depth. When embedded electrodes 55 are embedded in the contact holes 54, conduction between each region and the outside is established.

Figure 2H:
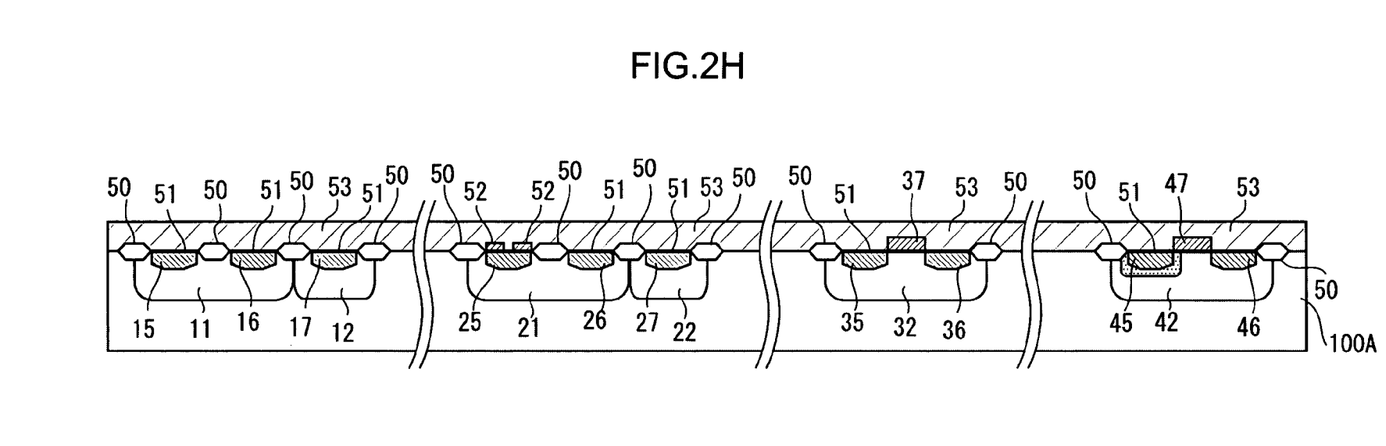

Next, as shown in FIG. 2H, an interlayer insulation layer 53 such as a phosphosilicate glass (PSG) layer, for example, is formed so as to cover the first bipolar transistor 10, the second bipolar transistor 20, the CMOS transistor 30, and the DMOS transistor 40.

Figure 4B:
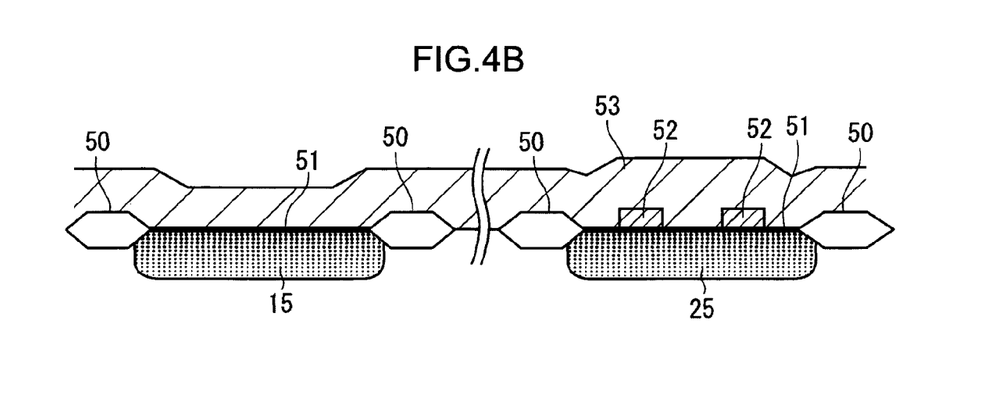

Here, as shown in FIG. 4B, when the interlayer insulation layer 53 is formed in a state where the dummy layer 52 has been formed so as to surround or sandwich the contact region 25A (in other words, the region in which the contact holes 54 are to be formed) of the emitter region 25 of the second bipolar transistor 20, the interlayer insulation layer 53 formed on the emitter region 25 (the contact region 25A of the emitter region 25) of the second bipolar transistor 20 is locally thick in comparison to the interlayer insulation layer 53 formed on the contact regions of each region of the other elements (the emitter region 15, the base region 16, and the collector region 17 of the first bipolar transistor 10, the base region 26 and the collector region 27 of the second bipolar transistor 20, the source region 35 and the drain region 36 of the CMOS transistor 30, and the source region 45 and the drain region 46 of the DMOS transistor 40). Specifically, the distance between the surface of the emitter region 25 (the contact region 25A of the emitter region 25) of the second bipolar transistor 20 and the surface of interlayer insulation layer 53 is greater than the distance between the surface of each region (the contact regions) of the other elements and the surface of the interlayer insulation layer 53.

In other words, whereas the distance between the surface of each region of the other elements and the surface of the interlayer insulation layer 53 is the same between those regions (the contact regions) of each of the other elements, the distance between the surface of the emitter region 25 (the contact region 25A of the emitter region 25) of the second bipolar transistor 20 and the surface of the interlayer insulation layer 53 is locally greater.

In the present exemplary embodiment, because the dummy layer 52 is formed so as to surround or sandwich the contact region 25A (i.e., the region in which the contact holes 54 are to be formed) of the emitter region 25 of the second bipolar transistor 20, the thickness of the interlayer insulation layer 53 on the contact region 25A of the emitter region 25 (the distance between the surface of the emitter region 25 (the contact region 25A of the emitter region 25) and the surface of the interlayer insulation layer 53) is constant.

Figure 3I:
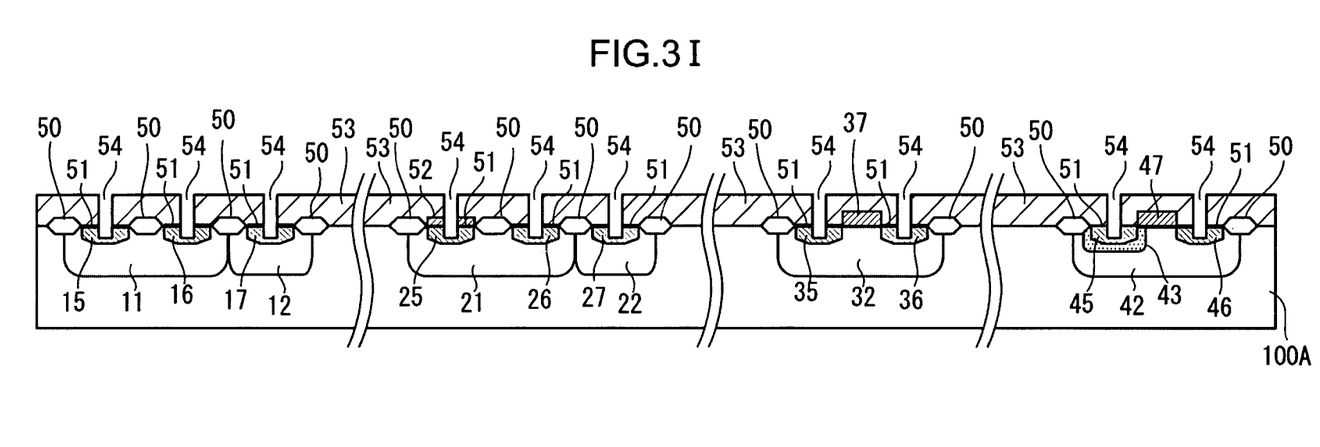
FIGS. 3I to 3J are process drawings showing the semiconductor device fabricating method pertaining to the first exemplary embodiment.

Next, as shown in FIG. 3I, a photoresist (not shown) having predetermined openings is formed by photolithography and etching. Then, this photoresist is used as a mask to form, by etching (e.g., reactive ion etching (RIE)), the contact holes 54 for establishing contact with each region in the interlayer insulation layer 53 and the contact region of each region of each element (the emitter region 15, the base region 16, and the collector region 17 of the first bipolar transistor 10, the emitter region 25, the base region 26, and the collector region 27 of the second bipolar transistor 20, the source region 35 and the drain region 36 of the CMOS transistor 30, and the source region 45 and the drain region 46 of the DMOS transistor 40). The contact holes 54 are formed in the interlayer insulation layer 53 and each region surface layer region of each element.

Figure 4C:
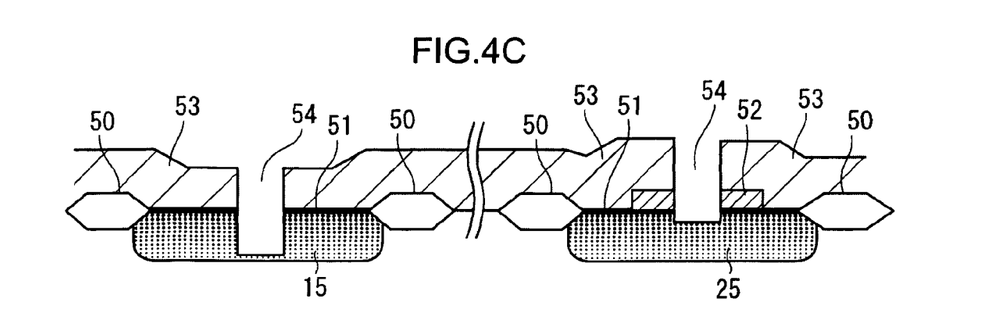

Here, the formation of the contact holes 54 for establishing contact with the contact region of each region of each element is performed in the same condition. Thus, as shown in FIG. 4C, because the interlayer insulation layer 53 formed on the contact region 25A of the emitter region 25 of the second bipolar transistor 20 is locally thick in comparison to the interlayer insulation layer 53 formed on the contact region of each region of the other elements, the formation depths (the contact depths) of the contact holes 54 become different.

Specifically, in correspondence to the interlayer insulation layer 53 formed on the contact region 25A of the emitter region 25 of the second bipolar transistor 20 being thicker than the interlayer insulation layer 53 formed on the contact region of each region of the other elements, the contact hole 54 formed in the contact region 25A of the emitter region 25 of the second bipolar transistor 20 is formed with a shallower contact depth as compared to the contact hole 54 in the contact region of each region of the other elements.

Additionally, when the contact depths are varied between the emitter region 15 of the first bipolar transistor 10 and the emitter region 25 of the second bipolar transistor 20, the depths at which the embedded electrodes embedded in the contact holes reach the emitter regions can be varied, so the effective impurity diffusion concentration in each emitter region changes depending on the impurity diffusion concentration gradient in the thickness direction of the impurity diffusion layer configuring each emitter region. As a result, the DC current gains (hfe) of the first bipolar transistor 10 and the second bipolar transistor 20 can be changed.

Specifically, because the contact depth of the emitter region 25 of the second bipolar transistor 20 is shallower than the contact depth of the emitter region 15 of the first bipolar transistor 10, the DC current gain (hfe) of the second bipolar transistor 20 is larger than that of the first bipolar transistor 10.

Figure 3J:
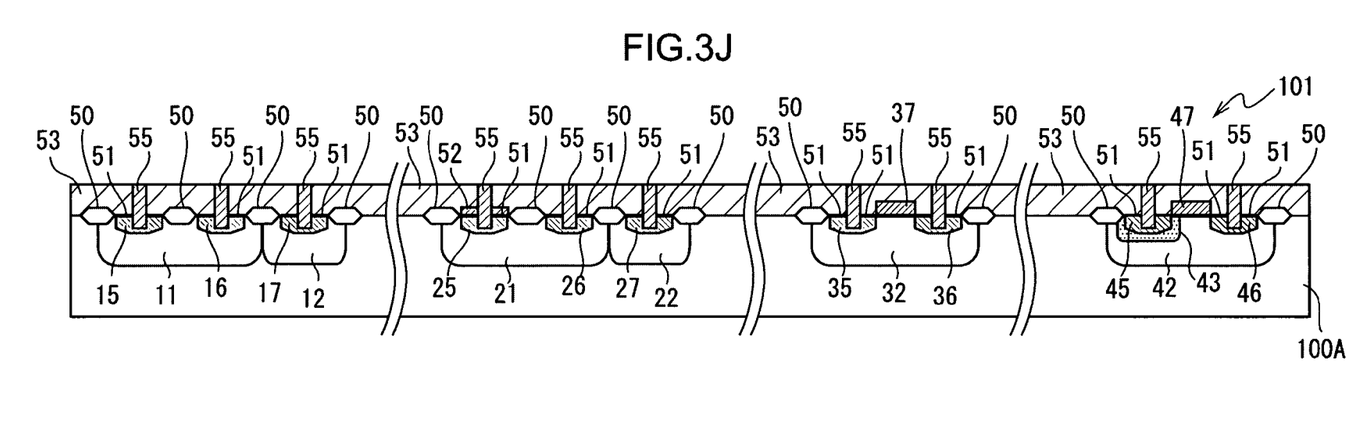

Next, as shown in FIG. 3J, a conductive member (e.g., tungsten) is embedded in each of the contact holes 54 to form embedded electrodes 55. Thus, conduction between each region of each element and the outside is established.

Then, although it is not shown, thereafter, wiring layers and external terminals are formed on the interlayer insulation layer 53 such that they connect to the embedded electrodes 55. Thereafter, a semiconductor device 101 is obtained.

In the semiconductor device fabricating method pertaining to the present exemplary embodiment described above, the contact hole 54 in the emitter region 25 of the second bipolar transistor 20 is formed with a shallower contact depth as compared to the contact hole 54 in the emitter region 15 of the first bipolar transistor 10, because the thickness of the interlayer insulation layer 53 can be made thick by forming the dummy layer 52 on, or on the periphery of, the emitter region 25 of the second bipolar transistor 20 and on the environs of the contact region 25A in that emitter region 25 (specifically, in the present exemplary embodiment, by forming the dummy layer 52 so as to surround or sandwich the contact region 25A of the emitter region 25 of the second bipolar transistor 20).

That is, the DC current gains (hfe) of the first bipolar transistor 10 and the second bipolar transistor 20 can be changed as described above just by forming the dummy layer 52.

Consequently, in the semiconductor device fabricating method pertaining to the present exemplary embodiment, a semiconductor device in which plural bipolar transistors having different DC current gains (hfe) are hybridized is obtained easily and with a few number of steps.

In particular, in the semiconductor device fabricating method pertaining to the present exemplary embodiment, the polysilicon layer is employed as the dummy layer 52 and is formed at the same time as the gate electrodes comprising the polysilicon layer in the CMOS transistor 30 and the DMOS transistor 40. For this reason, there is obtained a semiconductor device in which the dummy layer 52 is formed with no substantial increase in the number of steps and in which plural bipolar transistors having different DC current gains (hfe) are hybridized.

Further, in the semiconductor device fabricating method pertaining to the present exemplary embodiment, the polysilicon layer is employed as the dummy layer 52 and is formed so as to connect to the contact holes 54, that is, so as to connect to the conductive member configuring the embedded electrodes 55, so the dummy layer 52 comprising the polysilicon layer and the embedded electrode 55 have the same electric potential, and the electric potential of the contact resulting from the embedded electrode 55 in the emitter region of the second bipolar transistor is no longer affected.

Further, in the semiconductor device fabricating method pertaining to the present exemplary embodiment, because a semiconductor device in which plural bipolar transistors having different DC current gains (hfe) are hybridized is obtained by forming the contact holes 54 for establishing contact with each region of each element such that the diameters of the contact holes 54 are all a single size, that is, by making the formation conditions of the contact holes 54 the same, a reduction in the number of steps is achieved and a lowering of cost can be realized.

Further, by forming the contact holes 54 such that their diameters are all a single size, the shapes after etch back (e.g., tungsten etch back) of the embedded electrodes 55 (the conductive member) no longer vary in the semiconductor substrate (wafer) plane.

(Second Exemplary Embodiment)

FIGS. 8A to 8D are process drawings showing a semiconductor device fabricating method pertaining to a second exemplary embodiment.

Figure 8A:
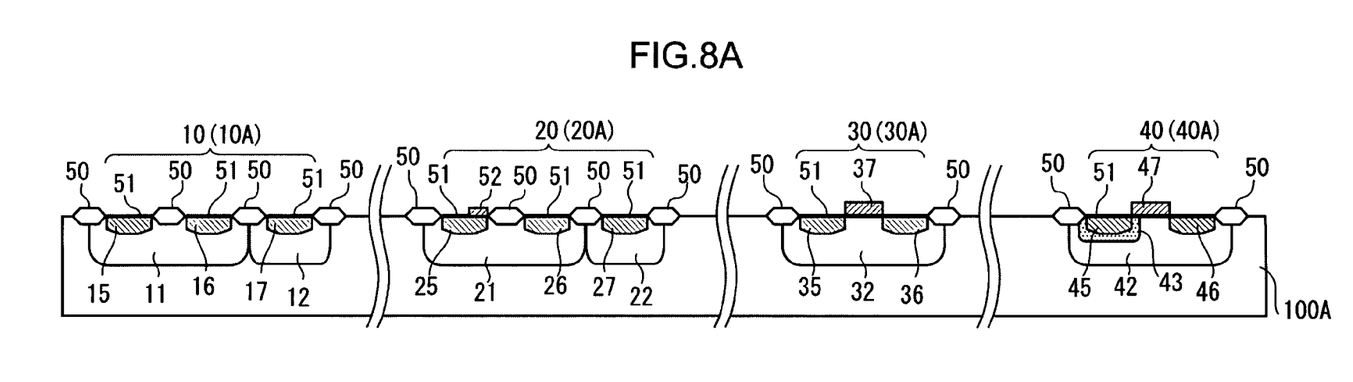
FIGS. 8A to 8D are process drawings showing a semiconductor device fabricating method pertaining to a second exemplary embodiment.

In the semiconductor device fabricating method pertaining to the second exemplary embodiment, first, as shown in FIG. 8A, the first bipolar transistor 10, the second bipolar transistor 20, the CMOS transistor 30, and the DMOS transistor 40 are formed on the same semiconductor substrate 100A.

These elements are formed through the same steps as the steps in FIG. 1A to FIG. 3G in the first exemplary embodiment.

Figure 9A:
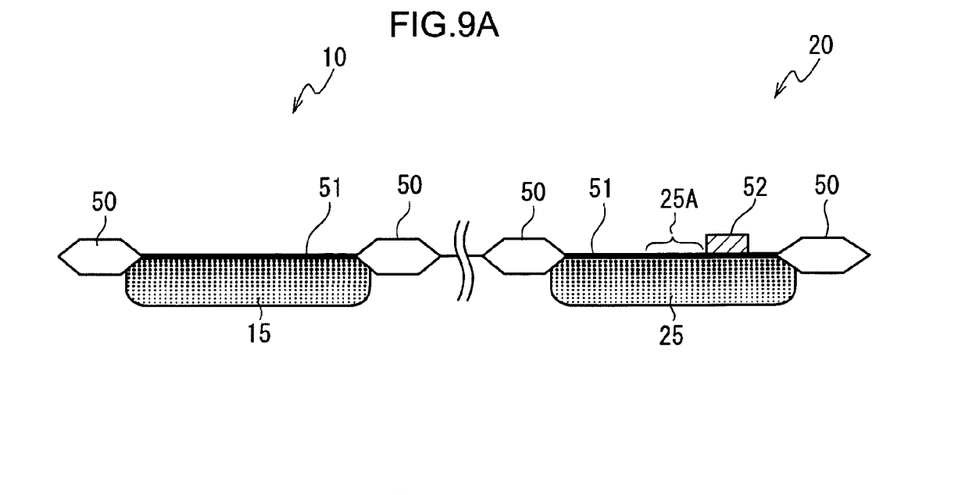
FIGS. 9A to 9C are process drawings showing emitter regions, and their environs, of first and second bipolar transistors in the semiconductor device fabricating method pertaining to the second exemplary embodiment.

Then, as shown in FIG. 9A, together with the formation of the gate electrodes in the CMOS transistor formation region 30A and the DMOS transistor formation region 40A, a polysilicon layer is similarly formed such that it is unevenly distributed on the emitter region 25 (or on the periphery of the emitter region 25; in the present exemplary embodiment, on the emitter region 25) in the second bipolar transistor formation region 20A and on one side of the contact region 25A in the emitter region 25 as the environs of the contact region 25A in the emitter region 25. The polysilicon layer is etched to form the dummy layer 52 comprising that polysilicon layer.

Figure 10:
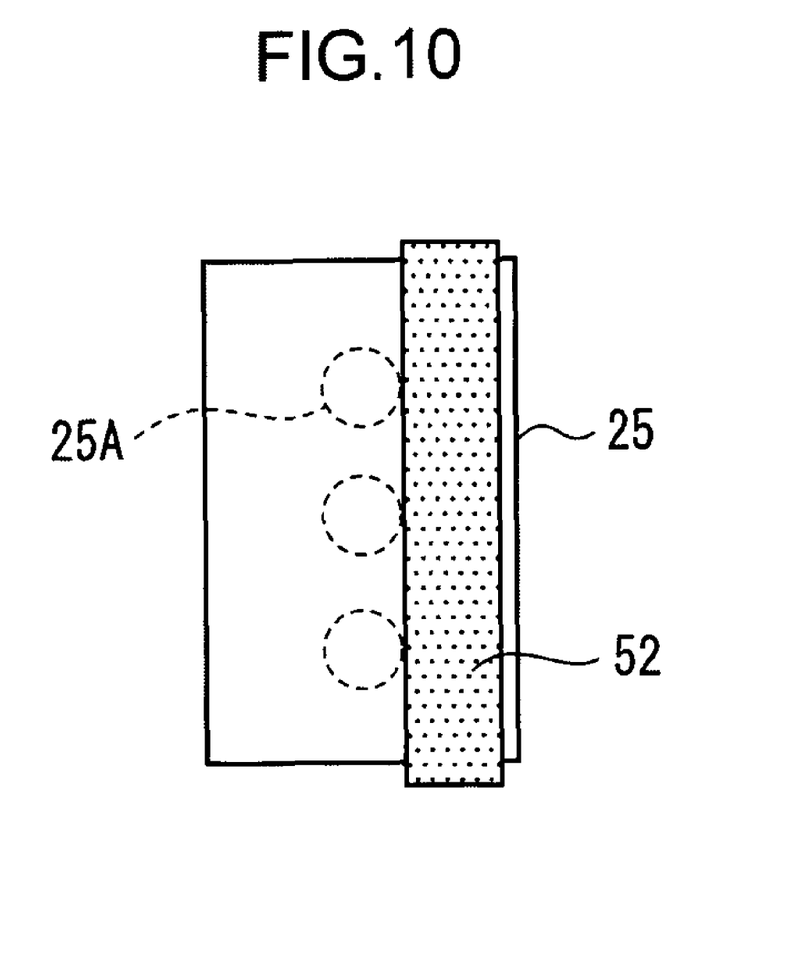
FIG. 10 is a plan drawing for describing an example of a dummy layer formation position in the semiconductor device fabricating method pertaining to the second exemplary embodiment.

Specifically, for example, as shown in FIG. 10, the dummy layer 52 is formed so as to contact the to-be-formed contact holes 54 along one side of the contact region 25A of the emitter region 25, that is, the region in which the contact holes 54 (in the present exemplary embodiment, three contact holes 54) are to be formed.

Figure 8B:
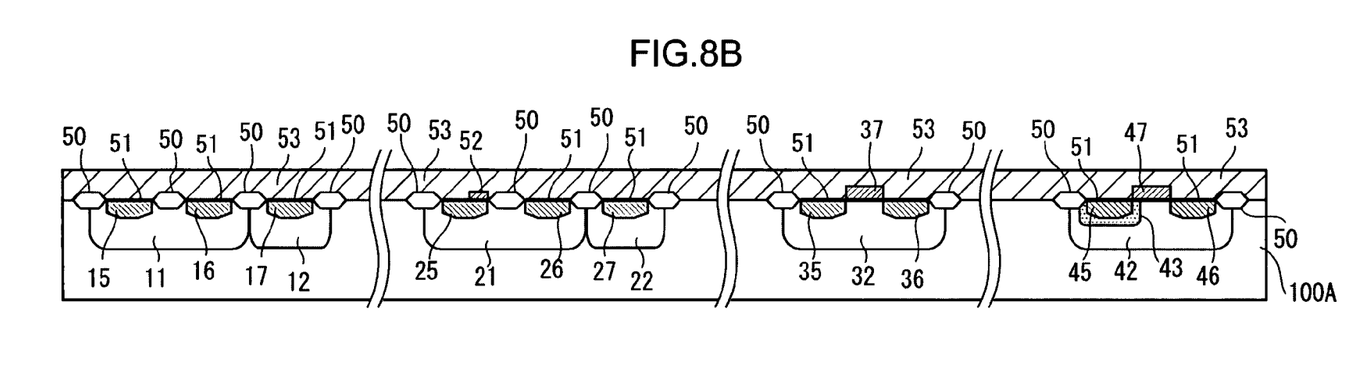

Next, as shown in FIG. 8B, the interlayer insulation layer 53 such as a phosphosilicate glass (PSG) layer, for example, is formed so as to cover the first bipolar transistor 10, the second bipolar transistor 20, the CMOS transistor 30, and the DMOS transistor 40.

Figure 9B:
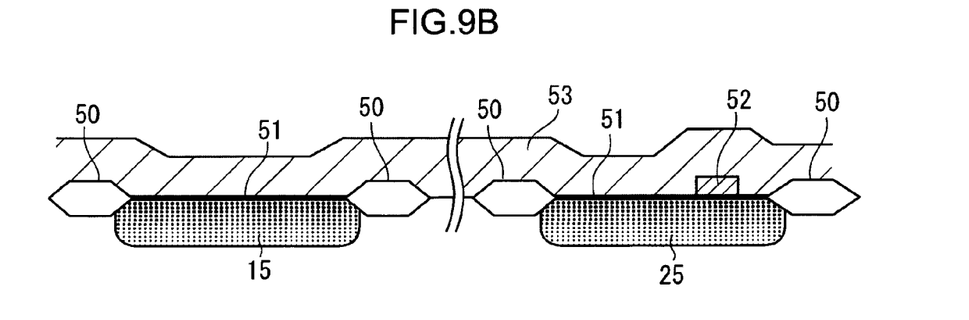

Here, as shown in FIG. 9B, when the interlayer insulation layer 53 is formed in a state where the dummy layer 52 has been formed such that it is unevenly distributed on one side of the contact region 25A (i.e., the region in which the contact holes 54 are to be formed) of the emitter region 25 of the second bipolar transistor 20, of each region of each element, only the interlayer insulation layer 53 formed on the dummy layer 52 is locally thick. Thus, because the dummy layer 52 is formed such that it is unevenly distributed on one side of the contact region 25A of the emitter region 25 of the second bipolar transistor 20, the thickness of the interlayer insulation layer 53 formed on the contact region 25A becomes thicker toward the dummy layer 52 side. That is, the interlayer insulation layer 53 formed on the contact region 25A of the emitter region 25 of the second bipolar transistor 20 is formed such that its surface slants with respect to the surface of the semiconductor substrate 100A.

Specifically, the distance between the surface of the emitter region 25 (the contact region 25A of the emitter region 25) of the second bipolar transistor 20 and the surface of the interlayer insulation layer 53 becomes greater toward the dummy layer 52 side.

In other words, whereas the distance between the surface of each region of the other elements and the surface of the interlayer insulation layer 53 is constant, the distance between the surface of the emitter region 25 (the contact region 25A of the emitter region 25) of the second bipolar transistor 20 and the surface of the interlayer insulation layer 53 fluctuates such that it gradually becomes greater.

Figure 8C:
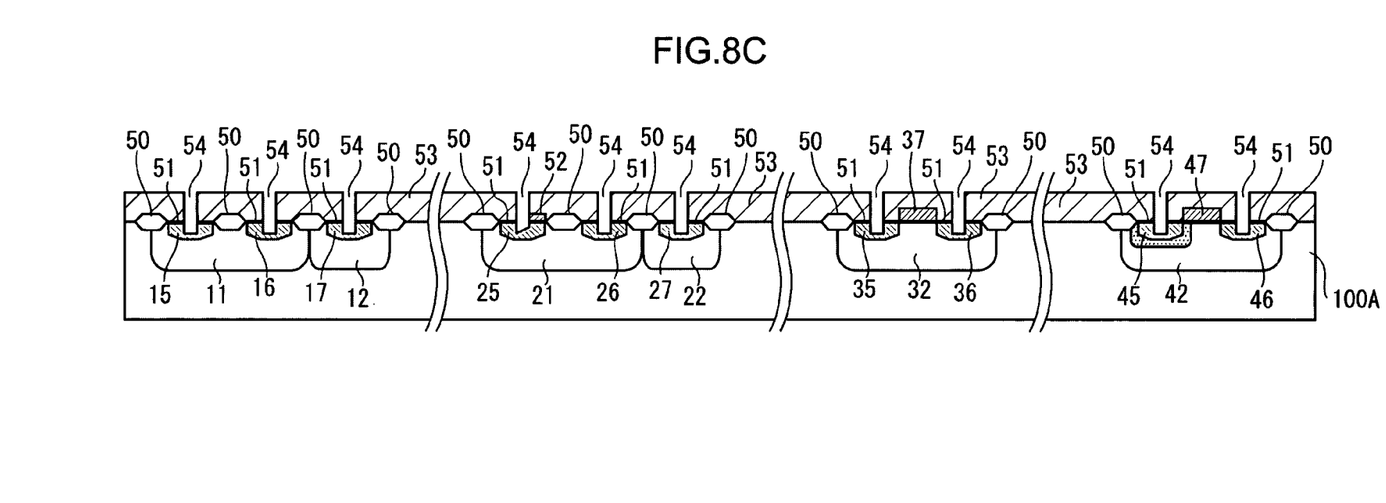

Next, as shown in FIG. 8C, a photoresist (not shown) having predetermined openings is formed by photolithography and etching. Then, this photoresist is used as a mask to form, by etching (e.g., reactive ion etching (RIE)) the contact holes 54 for establishing contact with each region in the interlayer insulation layer 53 and the contact region of each region of each element. The contact holes 54 are formed in the interlayer insulation layer 53 and each region surface layer region of each element.

Figure 9C:
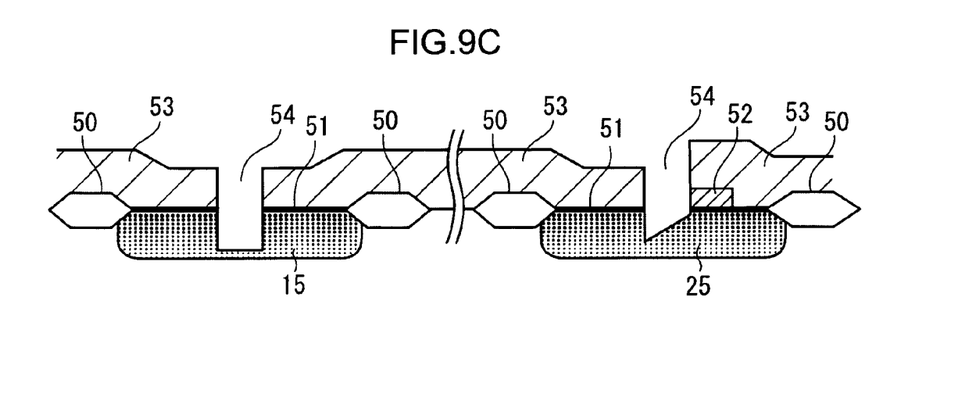

Here, when the contact hole 54 for establishing contact with the emitter region 25 is formed in a state where the surface of the interlayer insulation layer 53 formed on the emitter region 25 (the contact region 25A of the emitter region 25) of the second bipolar transistor 20 slants, that is, in a state where the distance between the surface of the emitter region 25 (the contact region 25A of the emitter region 25) of the second bipolar transistor 20 and the surface of the interlayer insulation layer 53 fluctuates such that it gradually becomes greater, as shown in FIG. 9C, the bottom surface of the contact hole 54 formed in the contact region 25A of the emitter region 25 of the second bipolar transistor 20 is formed slanting with respect to the surface of the semiconductor substrate 100A. The bottom surfaces of the contact holes 54 formed in the other regions are substantially parallel with respect to the surface of the semiconductor substrate 100A.

Additionally, when the bottom surface of the contact hole 54 formed in the emitter region 25 of the second bipolar transistor 20 slants with respect to the surface of the semiconductor substrate 100A, the embedded electrode 55 can be slanted in the contact hole 54 with respect to the impurity diffusion concentration gradient in the thickness direction of the impurity diffusion layer configuring the emitter region 25, and contact, that is, contact at the place where the impurity diffusion concentration in the impurity diffusion layer is high and the place where the impurity diffusion concentration in the impurity diffusion layer is low, can be established with the embedded electrode 55. For this reason, the impurity diffusion concentration gradient is averaged, and the DC current gain (hfe) of the second bipolar transistor 20 can be stabilized.

Figure 8D:
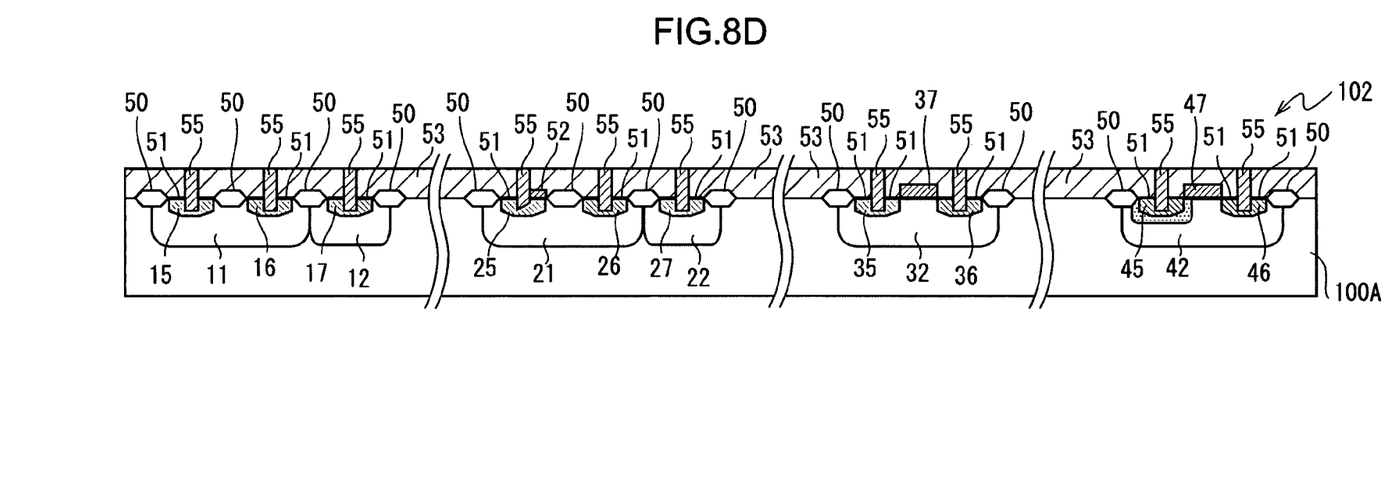

Next, as shown in FIG. 8D, a conductive member (e.g., tungsten) is embedded in each of the contact holes 54 to form the embedded electrodes 55. Thus, conduction between each region of each element and the outside is established.

Then, although it is not shown, thereafter, wiring layers and external terminals are formed on the interlayer insulation layer 53 such that they connect to the embedded electrodes 55. Thereafter, a semiconductor device 102 is obtained.

Portions other than these are the same as the first exemplary embodiment, so description will be omitted.

In the semiconductor device fabricating method pertaining to the present exemplary embodiment described above, like in the first exemplary embodiment, the DC current gains (hfe) of the first bipolar transistor 10 and the second bipolar transistor 20 can be changed just by forming the dummy layer 52.

In addition, the DC current gain (hfe) of the second bipolar transistor 20 can be stabilized as described above by forming the dummy layer 52 such that it is unevenly distributed on one side of the contact region 25A (i.e., the region in which the contact hole 54 is to be formed) of the emitter region 25 of the second bipolar transistor 20.

In both of the above-described exemplary embodiments, a configuration has been described where two bipolar transistors are formed, but the present invention is not limited to this. Because the DC current gains (hfe) can be changed just by changing the thickness of the dummy layer formed on bipolar transistors beginning with the second bipolar transistor, the present invention also includes an aspect where three or more bipolar transistors are formed on the same semiconductor substrate 100A.

In both of the above-described exemplary embodiments, a configuration has been described where the DC current gains (hfe) of the first bipolar transistor 10 and the second bipolar transistor 20 are changed by forming the dummy layer 52 on, or on the periphery of, the emitter region 25 of the second bipolar transistor 20 and on the environs of the contact region 25A in that emitter region 25, but the present invention is not limited to this and also includes an aspect where the DC current gains (hfe) of the first bipolar transistor 10 and the second bipolar transistor 20 are changed by forming the dummy layer 52 on, or on the periphery of, another region (the base region 26, the collector region 27) of the second bipolar transistor 20 and on the environs of the contact region in that other region.

However, the configuration where the dummy layer 52 is formed on the environs of the contact region of the emitter region 25 of the second bipolar transistor 20 is preferred because its effectiveness is high and the DC current gains (hfe) of the first bipolar transistor 10 and the second bipolar transistor 20 can be changed.

Further, in both of the above-described exemplary embodiments, a configuration has been described where a CMOS transistor and a DMOS transistor are formed together with bipolar transistors on the same semiconductor substrate, but the present invention also includes a configuration where one of a CMOS transistor and a DMOS transistor is formed and a configuration where neither a CMOS transistor nor a DMOS transistor is formed. Further, the present invention is not limited to a CMOS transistor and a DMOS transistor and also includes a configuration where another MOS transistor is formed.

Further, in both of the above-described exemplary embodiments, there are no particular limitations in regard to the configurations of the bipolar transistors and the MOS transistors (the CMOS transistor and the DMOS transistor). Each element may be formed by a publicly known configuration and a method of forming that publicly known configuration.

Neither of the above-described exemplary embodiments is intended to be interpreted in a limited way and can be realized in a scope that satisfies the requirements of the present invention.

What is claimed is:

1. A method of fabricating a semiconductor, the method comprising:

forming a first bipolar transistor including an emitter region, a base region, and a collector region on a semiconductor substrate;

forming a second bipolar transistor including an emitter region, a base region, and a collector region on the semiconductor substrate;

forming a dummy layer on, or on the periphery of, at least one region of the emitter region, the base region, or the collector region of the second bipolar transistor and on an area surrounding a contact region configured to establish an electrical connection to the outside in the at least one of the emitter region, the base region, or the collector region;

forming an insulation layer so as to cover the first bipolar transistor, the second bipolar transistor, and the dummy layer;

forming, together with the insulation layer and in a contact region of each region of the first bipolar transistor and the second bipolar transistor, contact holes for establishing contact with each of those regions, the contact holes including contact holes to the emitter region, the collector region, and the base region, respectively; and embedding a conductive member in the contact holes;

wherein at least one of the contact holes to the at least one region of the emitter region, the base region, or the collector region of the second bipolar transistor, on which the dummy layer is formed, is formed with a shallower contact depth than the contact hole of at least one region of the emitter region, the base region, or the collector region of the first bipolar transistor.

2. The method according to claim 1, wherein in the forming of the dummy layer, the dummy layer is formed surrounding or sandwiching the contact region in the at least one of the emitter region, the base region, or the collector region.

3. The method according to claim 1, wherein in the forming of the dummy layer, the dummy layer is formed unevenly distributed on one side of the contact region in the at least one of the emitter region, the base region, or the collector region.

4. The method according to claim 1, wherein the dummy layer is a polysilicon layer.

5. The method according to claim 4, wherein in the forming of the dummy layer, the dummy layer is formed so as to contact the conductive member embedded in the contact hole.

6. The method according to claim 4, further comprising forming a MOS transistor on the semiconductor substrate, wherein in the forming of the dummy layer, the polysilicon layer that becomes the dummy layer and a polysilicon layer that becomes a gate electrode of the MOS transistor are formed at the same time.

7. The method according to claim 6, wherein the MOS transistor is at least one selected from a CMOS transistor or a DMOS transistor.

8. The method according to claim 1, wherein in the forming of the dummy layer, the dummy layer is formed on, or on the periphery of, the emitter region of the second bipolar transistor and on the environs of the contact region in that emitter region.

9. The method according to claim 1, wherein in the forming of the contact holes, the diameters of each of the contact holes formed in the contact regions of each region of the first bipolar transistor and the second bipolar transistor are a single size.

10. A method of fabricating a semiconductor, the method comprising:

forming a first bipolar transistor including an emitter region, a base region, and a collector region on a semiconductor substrate;

forming a second bipolar transistor including an emitter region, a base region, and a collector region on the semiconductor substrate;

forming a dummy layer on, or on the periphery of, at least one region of the emitter region, the base region, or the collector region of the second bipolar transistor and on an area surrounding a contact region configured to establish an electrical connection to the outside in the at least one of the emitter region, the base region, or the collector region;

forming an insulation layer so as to cover the first bipolar transistor, the second bipolar transistor, and the dummy layer;

forming, together with the insulation layer and in a contact region of each region of the first bipolar transistor and the second bipolar transistor, contact holes for establishing contact with each of those regions, the contact holes including a contact hole to the emitter region; and embedding a conductive member in the contact holes;

wherein the contact hole in the emitter region of the second bipolar transistor, on which the dummy layer is formed, is formed with a shallower contact depth than the contact hole in the emitter region of the first bipolar transistor.

11. The method according to claim 10, wherein a bottom surface of the contact hole formed in the contact region of the emitter region of the second bipolar transistor is formed slanting with respect to a surface of the semiconductor substrate.

* * * * *